United States Patent
Lin et al.

(10) Patent No.: US 11,464,124 B2
(45) Date of Patent: Oct. 4, 2022

(54) CURVED DISPLAY AND METHOD FOR BINDING COVER GLASS OF CURVED DISPLAY

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Chung-Hung Lin, Guangdong (CN); Ming-Yang Li, Guangdong (CN); Po-Lin Chen, Guangdong (CN); Yen-Heng Huang, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 364 days.

(21) Appl. No.: 16/792,286

(22) Filed: Feb. 16, 2020

(65) Prior Publication Data

US 2021/0127516 A1 Apr. 29, 2021

(30) Foreign Application Priority Data

Oct. 25, 2019 (CN) .......................... 201911022682.5

(51) Int. Cl.
*G06T 7/73* (2017.01)
*H05K 5/02* (2006.01)
(Continued)

(52) U.S. Cl.
CPC .......... *H05K 5/0252* (2013.01); *G06T 7/001* (2013.01); *G06T 7/74* (2017.01); *H05K 5/0017* (2013.01);
(Continued)

(58) Field of Classification Search
CPC .......... G06F 1/1601; G06F 2200/1612; G06F 1/1637; H05K 5/0017; H05K 5/0217;
(Continued)

(56) References Cited

U.S. PATENT DOCUMENTS 7,089,073 B2 * 8/2006 Tsuji .................... H01L 21/6838
700/114
7,545,477 B2 * 6/2009 Lee ........................ G02F 1/1333
349/190
(Continued)

*Primary Examiner* — Ian L Lemieux
(74) *Attorney, Agent, or Firm* — CKC & Partners Co., LLC

(57) ABSTRACT

A curved display and a method for binding a cover glass of the curved display are provided. The curved display includes a display module, a frame body and a cover glass. The frame body has a first flat surface and a second flat surface opposite to the first flat surface, in which the first flat surface is adhered to the display module. The cover glass has a binding flat surface and an application surface opposite to the binding flat surface, in which the binding flat surface is adhered to the second flat surface of the frame body, and the application surface is a surface with curvature. The second flat surface of the frame body is set with a first alignment mark, and the binding flat surface of the cover glass is set with a second alignment mark, and the first alignment mark corresponds to the second alignment mark.

8 Claims, 9 Drawing Sheets

(51) Int. Cl.
*G06T 7/00* (2017.01)
*H05K 5/00* (2006.01)
*H05K 5/03* (2006.01)

(52) U.S. Cl.
CPC ............. *H05K 5/0217* (2013.01); *H05K 5/03* (2013.01); *G06T 2207/30121* (2013.01); *G06T 2207/30204* (2013.01)

(58) Field of Classification Search
CPC .................... H05K 5/0252; H05K 5/03; G06T 2207/30121; G06T 2207/30204; G06T 7/001; G06T 7/74; B32B 2457/20; B32B 37/12
See application file for complete search history.

(56) References Cited

U.S. PATENT DOCUMENTS

| | | | | |
|---|---|---|---|---|
| 8,797,474 | B2 * | 8/2014 | Wurzel | G02F 1/1333 |
| | | | | 349/58 |
| 9,061,485 | B2 * | 6/2015 | Kurimura | B32B 17/10706 |
| 10,466,600 | B2 * | 11/2019 | Zhang | G03F 9/7038 |
| 10,791,636 | B2 * | 9/2020 | Andou | H05K 1/028 |
| 10,792,955 | B2 * | 10/2020 | Ito | B32B 15/043 |
| 2002/0062787 | A1 * | 5/2002 | Hashizume | G02F 1/1341 |
| | | | | 118/671 |
| 2004/0169920 | A1 * | 9/2004 | Uehara | G03B 21/56 |
| | | | | 359/443 |
| 2013/0008379 | A1 * | 1/2013 | Chang | C23C 14/042 |
| | | | | 118/712 |
| 2016/0357294 | A1 * | 12/2016 | Ozeki | B32B 17/06 |
| 2020/0361817 | A1 * | 11/2020 | Li | H05K 5/0017 |
| 2021/0255500 | A1 * | 8/2021 | Kumar | B32B 17/10082 |

\* cited by examiner

CURVED DISPLAY AND METHOD FOR BINDING COVER GLASS OF CURVED DISPLAY

RELATED APPLICATIONS

This application claims priority to China Application Serial Number 201911022682.5, filed on Oct. 25, 2019, which is incorporated herein by reference.

BACKGROUND

Field of Invention

The present disclosure relates to a display device. More particularly, the present disclosure relates to a curved display and a method for binding a cover glass of the curved display.

Description of Related Art

Referring to FIG. 1, FIG. 1 is an exploded view of a conventional curved display 100. The conventional curved display 100 mainly includes a display module 110, a frame body 120 and a cover glass 130. Because two opposite side surfaces of the cover glass 130 are curved surfaces, a binding surface of the frame body 120 which is used to be bound to the cover glass 130 has to be designed to be curved to facilitate binding with the cover glass 130. However, when two curved surfaces are bound to each other for combining the frame body 120 and the cover glass 130, uneven binding force between the frame body 120 and the cover glass 130 often occurs, which causes glue leakage while the glue is being filled into the frame body 120. On the other hand, it is difficult for two curved surfaces to align with each other, thus resulting in inaccurate alignment between the two curved surfaces.

SUMMARY

The invention provides a binding method of a curved display, which can increase binding accuracy between a cover glass and a frame body of the curved display.

According to the aforementioned object, a curved display is provided. The curved display includes a display module, a frame body and a cover glass. The frame body has a first flat surface and a second flat surface opposite to the first flat surface, in which the first flat surface is adhered to the display module. The cover glass has a binding flat surface and an application surface opposite to the binding flat surface, in which the binding flat surface is adhered to the second flat surface of the frame body, and the application surface is a surface with curvature. The second flat surface of the frame body is set with a first alignment mark, and the binding flat surface of the cover glass is set with a second alignment mark, and the first alignment mark corresponds to the second alignment mark.

According to an embodiment of the present invention, the first flat surface of the frame body and the second flat surface of the frame body are respectively adhered to the display module and the cover glass by double sided tapes.

According to an embodiment of the present invention, an optical adhesive is filled between the frame body and the cover glass.

According to the aforementioned object, a method for binding a cover glass of a curved display is provided. The method includes the follow steps. A display module is provided. A frame body is adhered to the display module, in which the frame body has a first flat surface and a second flat surface opposite to the first flat surface, the first flat surface is adhered to the display module, and a first alignment mark is disposed on the second flat surface. A first position information of the first alignment mark is obtained by using an image capturing apparatus. A cover glass is moved to a position above the frame body, in which the cover glass has a binding flat surface and an application surface opposite to the binding flat surface, and a second alignment mark is disposed on the binding flat surface. The application surface is a curved surface. A second position information of the second alignment mark is obtained by using the image capturing apparatus. A relative position between the cover glass and the frame body is adjusted according to the first position information and the second position information to align the first alignment mark with the second alignment mark. The cover glass is adhered onto the frame body.

According to an embodiment of the present invention, the image capturing apparatus is disposed above the frame body, and the image capturing apparatus obtains the first position information before the cover glass is moved to the position above the frame body. The step of moving the cover glass to the position above the frame body includes moving the cover glass to a position between the frame body and the image capturing apparatus, and turning the binding flat surface of the cover glass to face the image capturing apparatus. After the image capturing apparatus is moved to the position between the frame body and the image capturing apparatus, the image capturing apparatus obtains the second position information.

According to an embodiment of the present invention, after the first alignment mark is aligned with the second alignment mark, the method further includes performing a turnover step to turn the cover glass to make the binding flat surface of the cover glass face the frame body.

According to an embodiment of the present invention, the first flat surface of the frame body and the second flat surface of the frame body are respectively adhered to the display module and the cover glass by double sided tapes.

According to an embodiment of the present invention, after the cover glass is adhered to the frame body, the method further includes filling an optical adhesive between the frame body and the cover glass.

According to the aforementioned embodiments of the present invention, the binding method of the present disclosure mainly uses the image capturing apparatus and alignment marks to utilize the alignment between the frame body and the cover glass. In addition, by designing the binding surface of the cover glass as a flat surface, the image capturing apparatus can be positioned by axis shifting, and a binding force between the flat surface and the double sided tapes is more uniform and stable, thereby achieving an effect of improving the binding accuracy.

BRIEF DESCRIPTION OF THE DRAWINGS

The invention can be more fully understood by reading the following detailed description of the embodiment, with reference made to the accompanying drawings as follows:

FIG. 3A through FIG. 3E are schematic diagrams showing a binding procedure of a curved display in accordance with an embodiment of the present disclosure;

DETAILED DESCRIPTION

Figure 1:
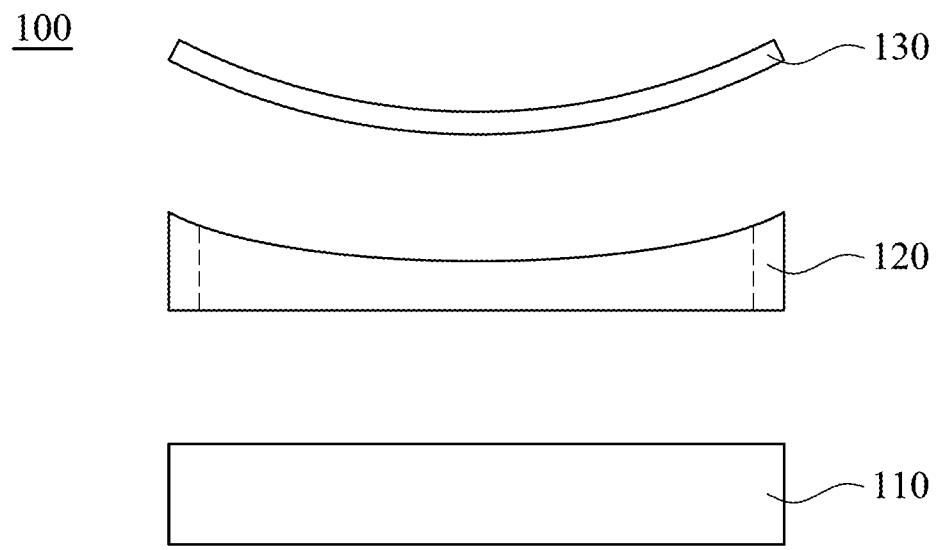
FIG. 1 is an exploded view of a conventional curved display.

Reference will now be made in detail to the present embodiments of the invention, examples of which are illustrated in the accompanying drawings. Wherever possible, the same reference numbers are used in the drawings and the description to refer to the same or like parts.

Figure 2:
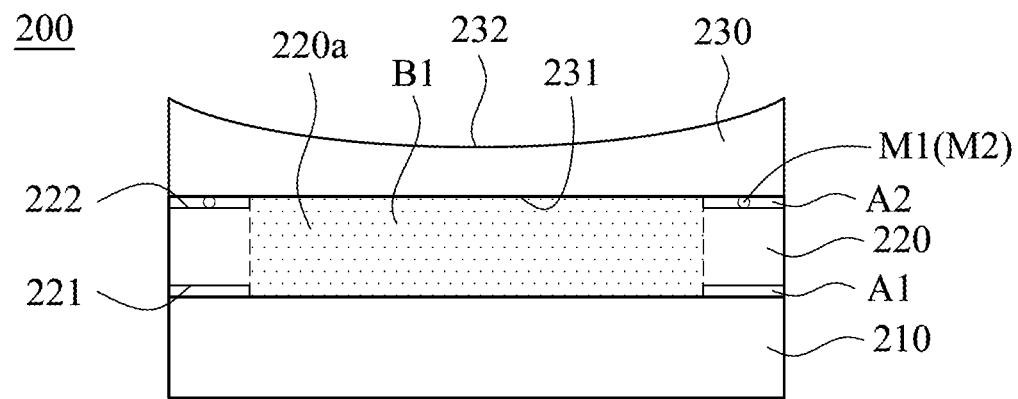
FIG. 2 is a schematic structural diagram showing a curved display in accordance with an embodiment of the present disclosure.

Referring to FIG. 2, FIG. 2 is a schematic structural diagram showing a curved display 200 in accordance with an embodiment of the present disclosure. The curved display 200 mainly includes a display module 210, a frame body 220 and a cover glass 230. In the present embodiment, the frame body 220 is adhered on the display module 210, and the cover glass 230 is adhered on the frame body 220. In one example, the frame body 220 is square or other closed shapes. Therefore, when the frame body 220 is disposed between the cover glass 230 and the frame body 220, an accommodating space 220a is formed among the frame body 220, the cover glass 230 and the frame body 220. The accommodating space 220a is configured to accommodate an optical adhesive B1.

As shown in FIG. 2, the frame body 220 has a first flat surface 221 and a second flat surface 222 opposite to the first flat surface 221, in which the first flat surface 221 is set with an adhesive member A1, and the first flat surface 221 of the frame body 220 is adhered to a surface of the display module 210 by the adhesive member A1. In addition, the cover glass 230 has a binding flat surface 231 and an application surface 232 opposite to each other, in which the application surface 232 is a curved surface. In addition, the binding flat surface 231 is set with an adhesive member A2, and the binding flat surface 231 of the cover glass 230 is adhered to the second flat surface 222 of the frame body 220 by the adhesive member A2. In some examples, the adhesive member A1 and the adhesive member A2 are double sided tapes.

Referring to FIG. 2 continuously, in the present embodiment, the second flat surface 222 of the frame body 220 is set with a first alignment mark M1, and the binding flat surface 231 of the cover glass 230 is set with a second alignment mark M2, in which the first alignment mark M1 and the second alignment mark M2 are corresponded to each other. In the embodiment of FIG. 2, the first alignment mark M1 and the second alignment mark M2 are overlapped with each other. In the present embodiment, the first alignment mark M1 and the second alignment mark M2 are used in an assembly process for aligning the cover glass 230 with the frame body 220. In some examples, first alignment mark M1 and the second alignment mark M2 are patterns or marks which are respectively disposed on the second flat surface 222 of the frame body 220 and the binding flat surface 231 of the cover glass 230.

Figure 3B:
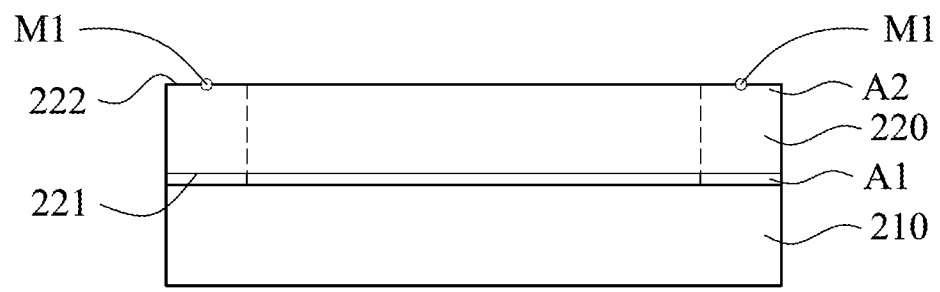

The following describes in detail of a binding method of the aforementioned curved display 200. Simultaneously referring to FIG. 3A to FIG. 4, in which FIG. 3A through FIG. 3E are schematic diagrams showing a binding procedure of a curved display in accordance with an embodiment of the present disclosure, and FIG. 4 is a schematic block diagram of a binding method 400 of a curved display in accordance with an embodiment of the present disclosure. In the binding method 400, a step 410 is first performed to provide the display module 210 as shown in FIG. 3A. It is noted that, the display module 210 described herein mainly includes components such as a backlight module, optical films, related circuits, and etc., and will not be described herein.

Thereafter, as shown in FIG. 3B and FIG. 4, a step 420 is performed to adhere the frame body 220 onto the display module 210, in which the frame body 220 has two opposite flat surfaces, such as the first flat surface 221 and the second flat surface 222. In the present embodiment, the second flat surface 222 of the frame body 220 is set with the first alignment mark M1.

Figure 3C:
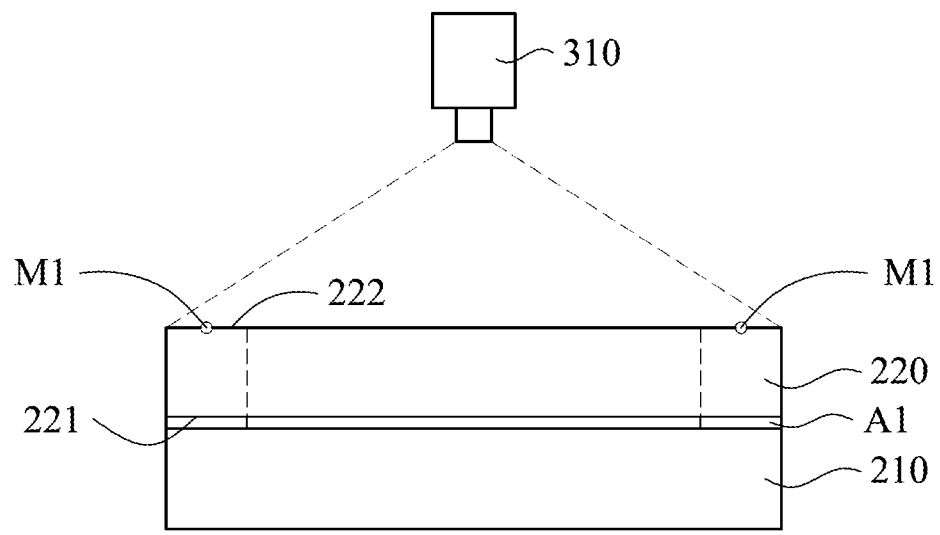
Figure 4:
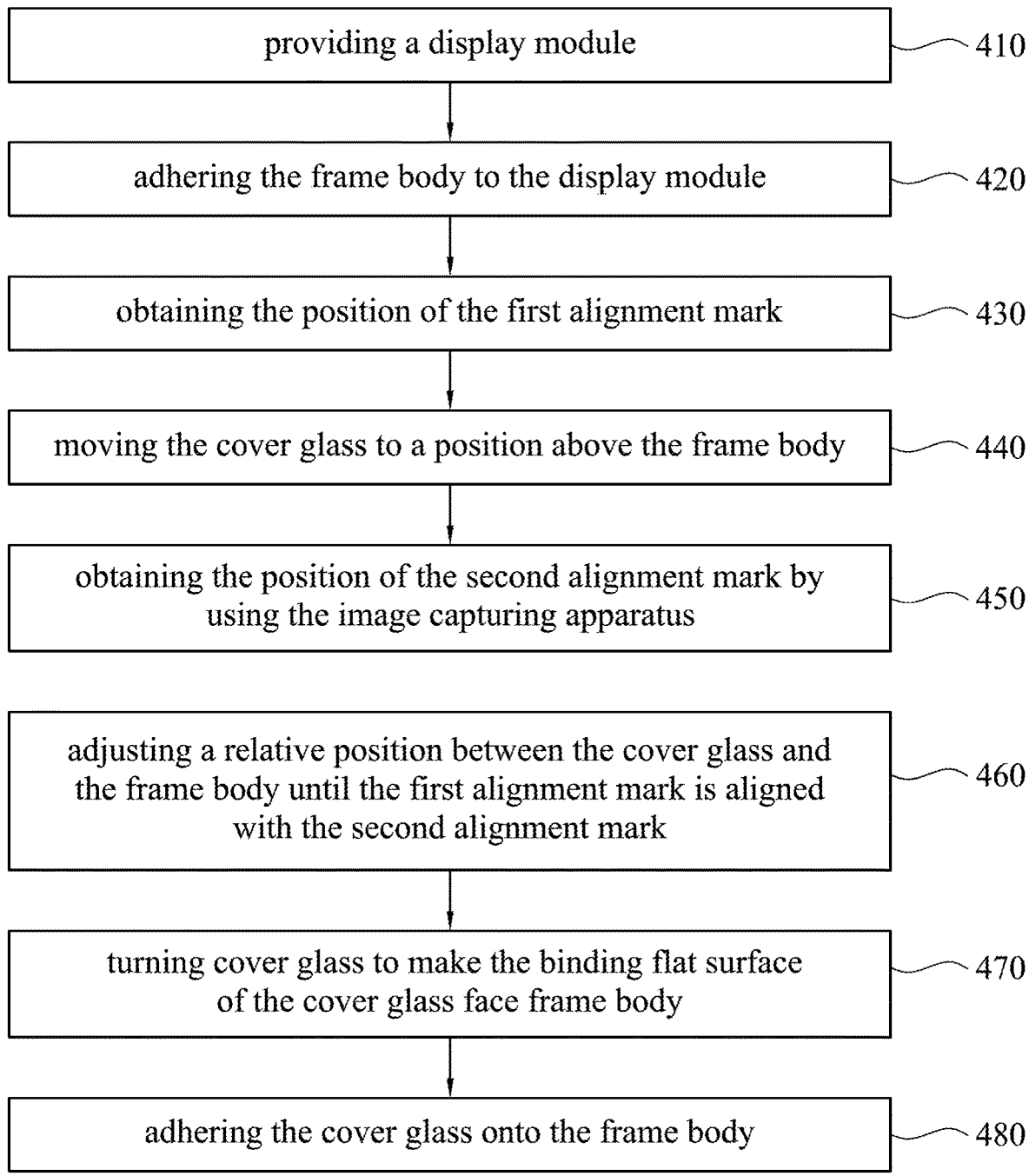
FIG. 4 is a schematic block diagram of a binding method of a curved display in accordance with an embodiment of the present disclosure.

Referring to FIG. 3C and FIG. 4, after the step 420 is performed, a step 430 is performed to use an image capturing apparatus 310 to obtain a first position information of the first alignment mark M1. In some examples, the first position information includes a coordinate position of the first alignment mark M1. In some embodiments, the image capturing apparatus 310 is disposed above the frame body 220. In some examples, the image capturing apparatus 310 includes a charge coupled device (CCD).

Figure 3D:
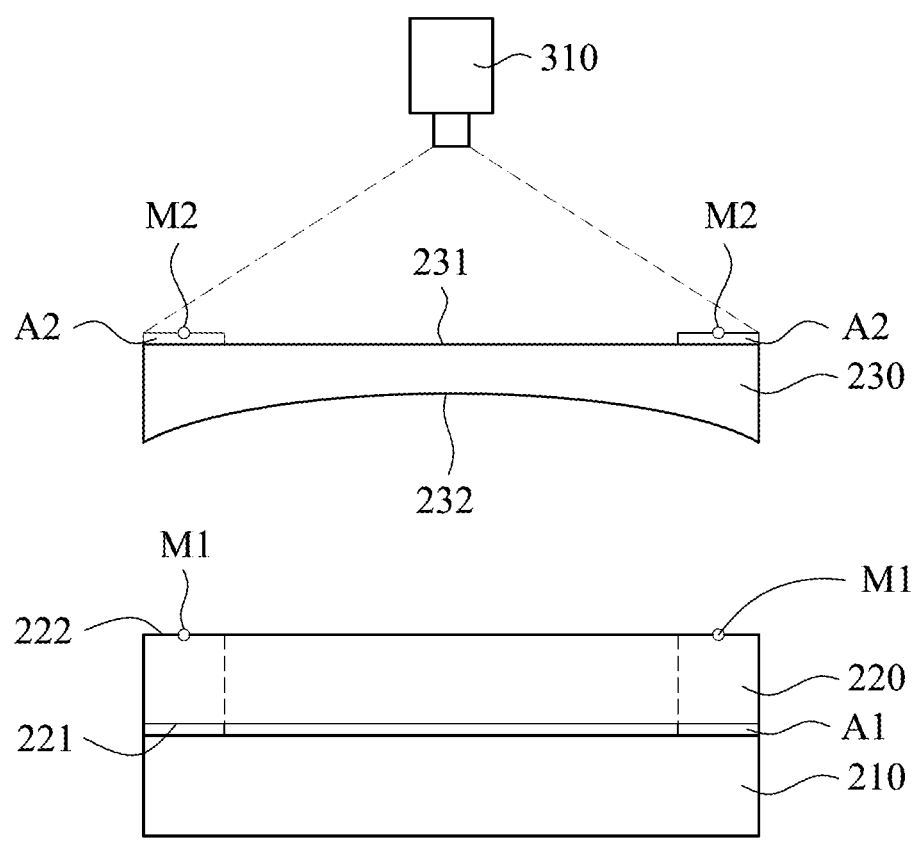

Then, as shown in FIG. 3D and FIG. 4, a step 440 is performed to move the cover glass 230 to a position above the frame body 220. More specifically, the cover glass 230 is first moved to a position between the frame body 220 and the image capturing apparatus 310 to make the binding flat surface 231 of the cover glass 230 face towards the image capturing apparatus 310.

Thereafter, after the cover glass 230 is moved to the position between the frame body 220 and the image capturing apparatus 310, a step 450 is performed to use the image capturing apparatus 310 to obtain a second position information of the second alignment mark M2. In some examples, the second position information includes a coordinate position of the second alignment mark M2.

After the image capturing apparatus 310 obtains the second position information of the second alignment mark M2, a step 460 is performed to adjust a relative position between the cover glass 230 and the frame body 220 according to the first position information of the first alignment mark M1 and the second position information of the second alignment mark M2, so as to align the first alignment mark M1 with the second alignment mark M2.

Figure 3E:
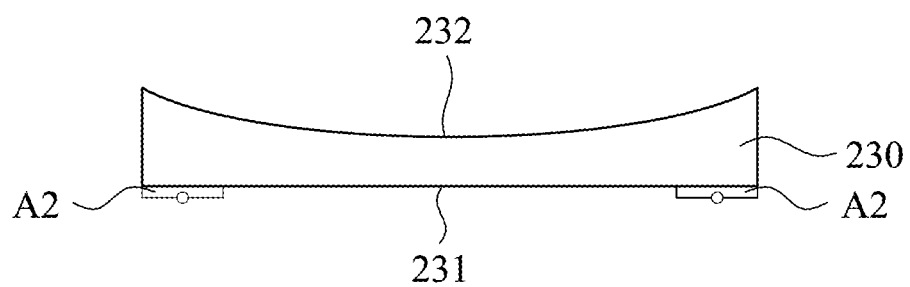
Figure 3E:
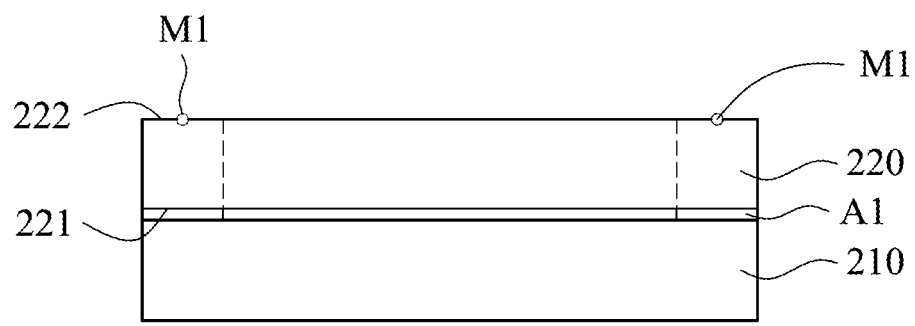

Referring to FIG. 3E and FIG. 4, after first alignment mark M1 is aligned with the second alignment mark, a step 470 is performed to turn the cover glass 230 to make the binding flat surface 231 of the cover glass 230 face the frame body 220.

Then, a step 480 is performed to adhere the cover glass 230 onto the frame body 220. After the cover glass 230 is adhered to the frame body 220, an optical adhesive is filled into the accommodating space 220a inside OF the frame body 220 through a filling hole opened on the frame body 220. Therefore, the curved display 200 as shown in FIG. 2 is obtained.

From the above, the present disclosure designs binding surfaces among the display module, the frame body and the cover glass as flat surfaces, such that instability of the binding between the curved surfaces is reduced. In addition, by designing the binding surface of the cover glass as a flat surface, the image capturing apparatus and alignment marks can be further used to align the cover glass with the frame body, so as to achieve an effect of improving the binding accuracy.

Figure 5A:
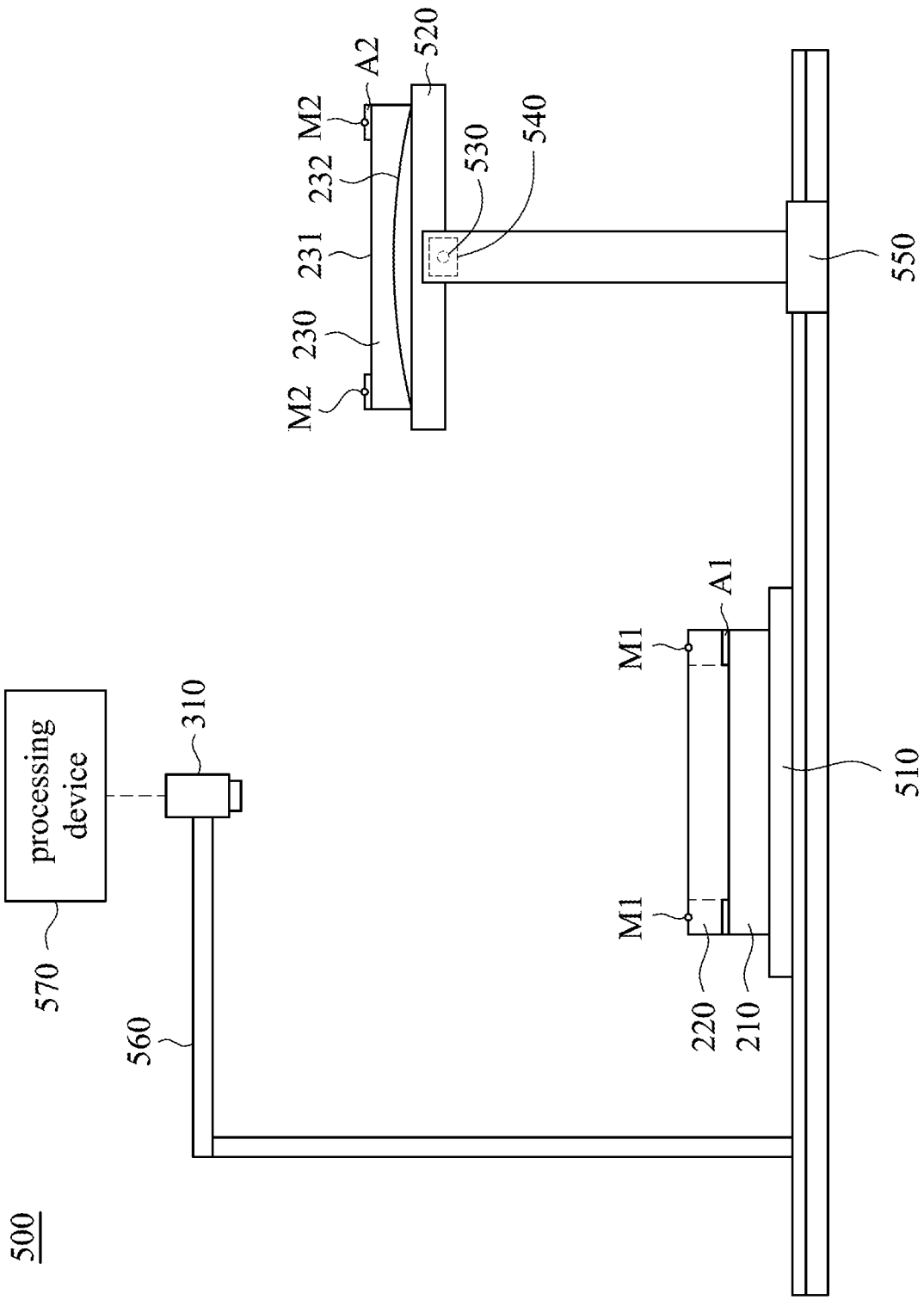
FIG. 5A through FIG. 5D are schematic diagrams showing a binding procedure for binding a curved display by using a binding machine in accordance with an embodiment of the present disclosure.
Figure 5B:
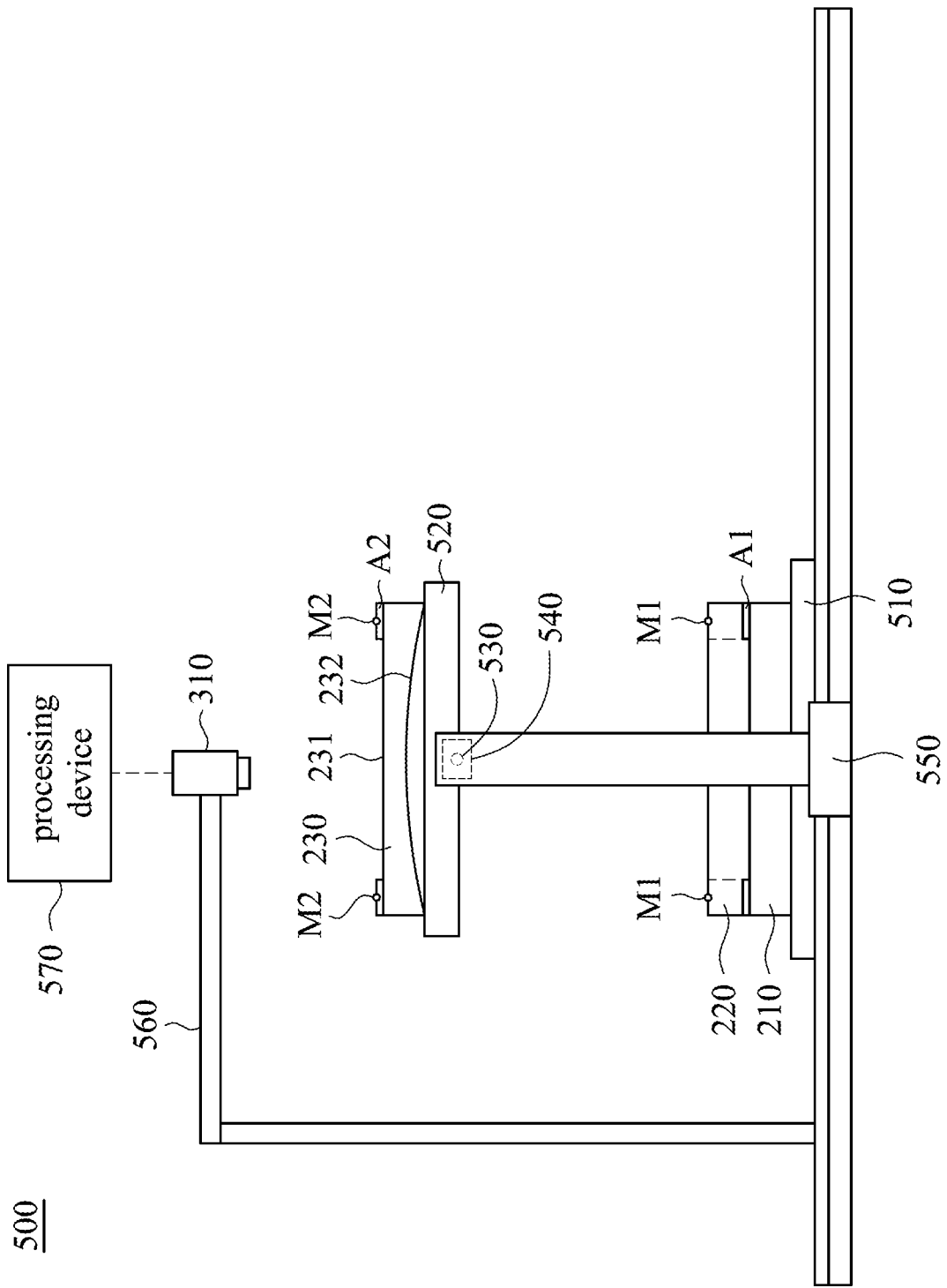

In some examples, a binding machine 500 as shown in FIG. 5A can be used to perform the binding method 400 of the curved display 200 as shown in FIG. 4. Referring to FIG. 4 to FIG. 5D, in which FIG. 5A through FIG. 5D are schematic diagrams showing a binding procedure for binding a curved display by using a binding machine in accordance with an embodiment of the present disclosure. As shown in FIG. 5A, the binding machine 500 mainly includes a first platform 510, a second platform 520, a turnover mechanism 530, a lifting mechanism 540, a sliding mechanism 550 and an adjusting mechanism 560. The display module 210 with the frame body 220 adhered thereon is disposed on the first platform 510, and the cover glass 230 is disposed on the second platform 520, in which the application surface 232 of the cover glass 230 is faced towards the second platform 520. In one example, both the first platform 510 and the second platform 520 are equipped with negative pressure devices which can respectively absorb the display module 210 and the cover glass 230.

Referring to FIG. 5A again, the image capturing apparatus 310 is disposed on the adjusting mechanism 560 and is located above the frame body 220. The image capturing apparatus 310 is used to capture the image of the first alignment mark M1 which is disposed on the frame body 220. In the present embodiment, the image capturing apparatus 310 is connected to the processing device 570. After the image capturing apparatus 310 obtains the image of the first alignment mark M1, the processing device 570 can calculate the first position information of the first alignment mark M1 according to the image of the first alignment mark M1. The second platform 520 is connected to the turnover mechanism 530, the lifting mechanism 540 and the sliding mechanism 550. The turnover mechanism 530 includes a driving device such as a pivot and a motor which can flip the second platform 520. Each of the lifting mechanism 540 and the sliding mechanism 550 includes components such as sliding blocks, sliding rails and motors which can drive the second platform 520 to move relative to the first platform 510 along a horizontal direction and a vertical direction. In other examples, the lifting mechanism 540 and the sliding mechanism 550 can be implemented by the components such as pressure cylinders and screws. In addition, the adjusting mechanism 560 includes components such as sliding blocks, sliding rails and motors which can adjust the position of the image capturing apparatus 310.

As shown in FIG. 5A, before the second platform 520 is moved to a position above the first platform 510, the image capturing apparatus 310 is used to capture the image of the first alignment mark M1 on the frame body 220, and the processing device 570 is used to identify a position of the first alignment mark M1, thereby obtaining the first position information of the first alignment mark M1. As shown in FIG. 5B, after the image capturing apparatus 310 obtains the first position information of the first alignment mark M1, the sliding mechanism 550 can be used to drive the second platform 520, so as to move the second platform 520 to the position above the frame body 220. Meanwhile, the image capturing apparatus 310 is used to capture an image of the second alignment mark M2 which is disposed on the cover glass 230, and the processing device 570 can further calculate the second position information of the second alignment mark M2 according to the image of the second alignment mark M2. In addition, the processing device 570 further determines the relative position between the cover glass 230 and the frame body 220 according to the first position information and the second position information, so as to further control the sliding mechanism 550 to adjust the second platform 520 until the first alignment mark M1 is aligned with the second alignment mark M2.

Figure 5C:
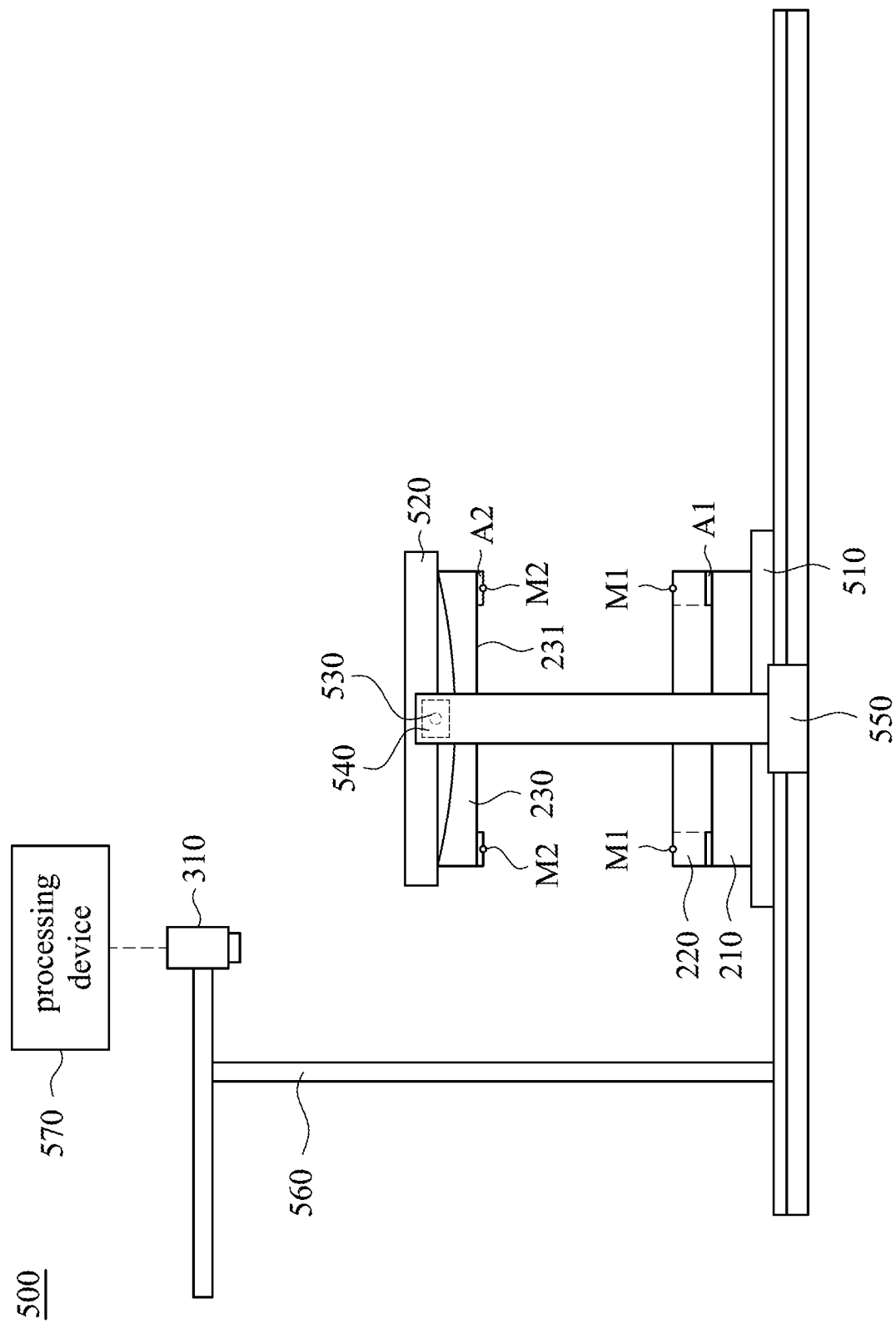
Figure 5D:
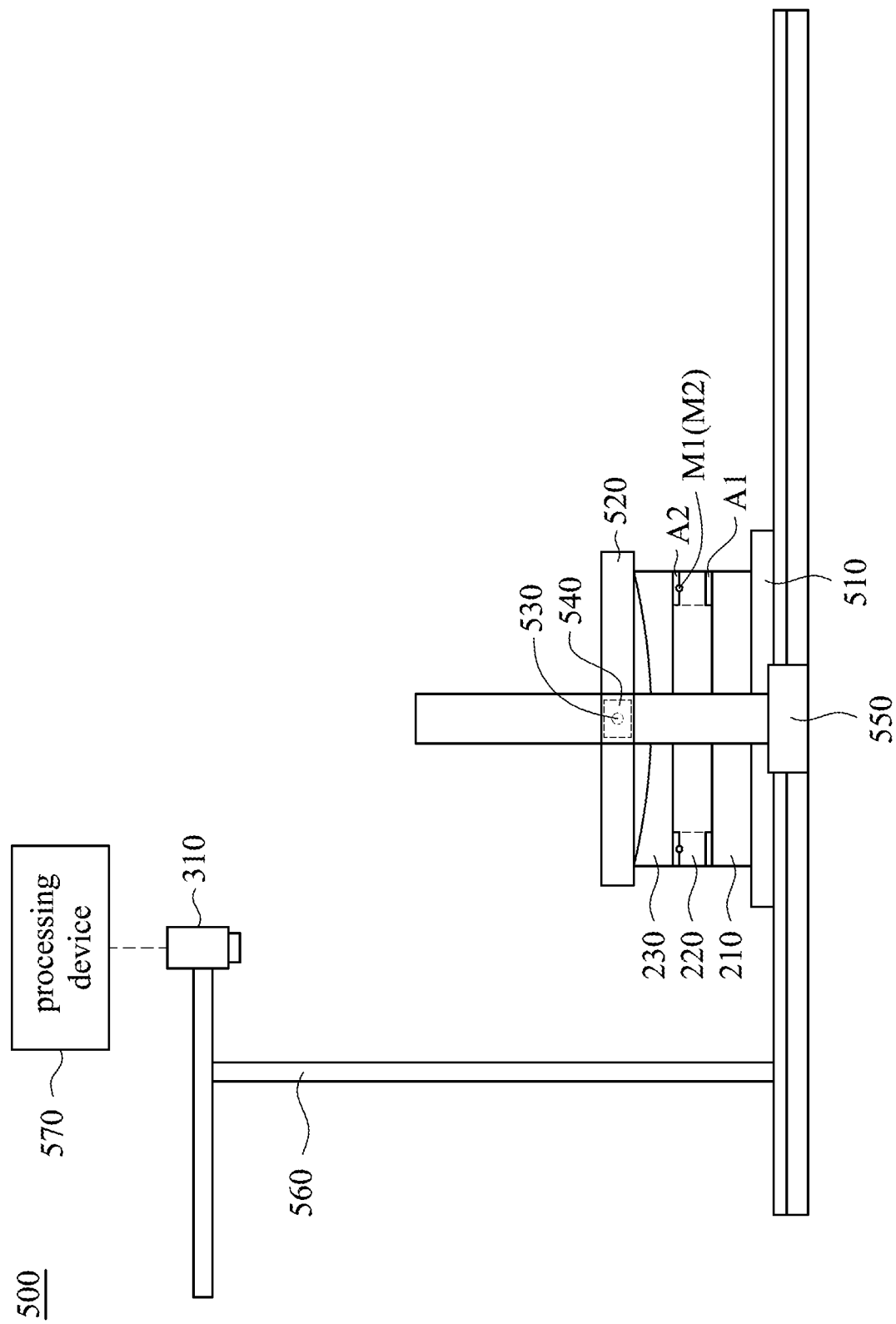

As shown in FIG. 5C, after the cover glass 230 is aligned with the frame body 220, the turnover mechanism 530 is used to turn the second platform 520, so as to make the binding flat surface 231 of the cover glass 230 face the first platform 510. Then, as shown in FIG. 5D, the lifting mechanism 540 is used to drive the second platform 520 to move downwards, thereby binding the cover glass 230 located on the second platform 520 to the frame body 220.

According to the aforementioned embodiments of the present invention, the binding method of the present disclosure mainly uses the image capturing apparatus and alignment marks to utilize the alignment between the frame body and the cover glass. In addition, by designing the binding surface of the cover glass as a flat surface, the image capturing apparatus is positioned by axis shifting, and a binding force between the flat surface and the double sided tapes is more uniform and stable, thereby achieving an effect of improving the binding accuracy.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A curved display, comprising:
   a display module;
   a frame body having a first flat surface and a second flat surface, which are respectively located on two opposite sides of the frame body, wherein the first flat surface is adhered to the display module; and
   a cover glass having a binding surface and an application surface, which are respectively located on two opposite sides of the cover glass, wherein the binding surface is adhered to the second flat surface of the frame body, the frame body is sandwiched between the cover glass and the display module, the entire binding surface is a flat surface, and the application surface is a surface with curvature;
   wherein the second flat surface of the frame body is set with a first alignment mark, and the binding surface of the cover glass is set with a second alignment mark, and the first alignment mark corresponds to the second alignment mark.

2. The curved display of claim 1, wherein the first flat surface of frame body and the second flat surface of the frame body are respectively adhered to the display module and the cover glass by double sided tapes.

3. The curved display of claim 1, wherein an optical adhesive is filled between the frame body and the cover glass.

4. A method for binding a cover glass of a curved display, comprising:
   providing a display module;
   adhering a frame body to the display module, wherein the frame body has a first flat surface and a second flat surface, which are respectively located on two opposite sides of the frame body, the first flat surface is adhered to the display module, and a first alignment mark is disposed on the second flat surface;

obtaining a first position information of the first alignment mark by using an image capturing apparatus;

moving a cover glass to a position above the frame body, wherein the cover glass has a binding surface and an application surface, which are respectively located on two opposite sides of the cover glass, a second alignment mark is disposed on the binding surface, the entire binding surface is a flat surface, and the application surface is a curved surface;

obtaining a second position information of the second alignment mark by using the image capturing apparatus; and adjusting a relative position between the cover glass and the frame body according to the first position information and the second position information to align the first alignment mark with the second alignment mark; and adhering the cover glass onto the second flat surface of the frame body, wherein the frame body is sandwiched between the cover glass and the display module.

5. The method of claim 4, wherein the image capturing apparatus is disposed above the frame body, and the image capturing apparatus obtains the first position information before the cover glass is moved to the position above the frame body;

moving the cover glass to the position above the frame body comprises moving the cover glass to a position between the frame body and the image capturing apparatus, and turning the binding flat surface of the cover glass to face the image capturing apparatus; and after the cover glass is moved to the position between the frame body and the image capturing apparatus, the image capturing apparatus obtains the second position information.

6. The method of claim 5, wherein after the first alignment mark is aligned with the second alignment mark, the method further comprises performing a turnover step to turn the cover glass to make the binding surface of the cover glass face the frame body.

7. The method of claim 4, wherein the first flat surface of the frame body and the second flat surface of the frame body are respectively adhered to the display module and the cover glass by double sided tapes.

8. The method of claim 4, wherein after the cover glass is adhered to the frame body, the method further comprises filling an optical adhesive between the frame body and the cover glass.

* * * * *